United States Patent
Dow et al.

(10) Patent No.: US 10,784,830 B2
(45) Date of Patent: *Sep. 22, 2020

(54) SPEAKER VOLUME PREFERENCE LEARNING

(71) Applicant: International Business Machines Corporation, Armonk, NY (US)

(72) Inventors: Eli M. Dow, Wappingers Falls, NY (US); Thomas D. Fitzsimmons, Lancaster, PA (US); Maurice M. Materise, Poughkeepsie, NY (US); Jessie Yu, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 43 days.

This patent is subject to a terminal disclaimer.

(21) Appl. No.: 16/244,323

(22) Filed: Jan. 10, 2019

(65) Prior Publication Data

US 2019/0149114 A1 May 16, 2019

Related U.S. Application Data

(63) Continuation of application No. 15/879,466, filed on Jan. 25, 2018, now Pat. No. 10,243,528, which is a
(Continued)

(51) Int. Cl.
*H03G 3/32* (2006.01)
*H03G 3/00* (2006.01)
(Continued)

(52) U.S. Cl.
CPC ............ *H03G 3/001* (2013.01); *H03G 3/002* (2013.01); *H03G 3/04* (2013.01); *H03G 3/3005* (2013.01); *H03G 3/3026* (2013.01); *H03G 3/32* (2013.01)

(58) Field of Classification Search
CPC ............ H03G 3/001–002; H03G 3/04; H03G 3/3005; H03G 3/3026; H03G 3/32
(Continued)

(56) References Cited

U.S. PATENT DOCUMENTS 8,306,235 B2    11/2012   Mahowald
9,319,019 B2 *   4/2016   Selig ...................... G06F 3/165
(Continued)

FOREIGN PATENT DOCUMENTS

| WO | 0227985 A2 | 4/2002 |
| WO | 2008076517 A1 | 6/2008 |
| WO | 2015062401 A1 | 5/2015 |

OTHER PUBLICATIONS

Cole et al., "Learning User Volume Control Preferences in Hearing Aids", Canadian Acoustics / Acoustique canadienne, vol. 35 No. 3 (2007)—70, 2 pages.
(Continued)

*Primary Examiner* — Disler Paul
(74) *Attorney, Agent, or Firm* — Edward J. Wixted, III; Brian M. Restauro

(57) ABSTRACT

Audio information of audio content being listened to by a user is received. An aspect of a listening environment of the user is identified. A volume preset, based on the audio information and the aspect of the listening environment, is determined to be available. A first volume of the audio content being listened to by the user is determined to be different from the volume preset. The first volume of the audio content is adjusted to a second volume.

20 Claims, 4 Drawing Sheets

| VOLUME ATTRIBUTE 302 | DEFAULT VOLUME PRESET 304 |
|---|---|
| SPEAKER DRIVERS: 1 / 2-3 / >3 | 3 / 5 / 7 |
| AUDIO: LIVE / RECORDED | 6 / 4 |
| GENRE: HEAVY METAL, ROCK, HIP HOP, ELECTRONIC DANCE MUSIC | 8 |
| GENRE: COUNTRY WESTERN, EASY LISTENING, POP, RHYTHM AND BLUES | 6 |
| GENRE: CLASSICAL, JAZZ, INSPIRATIONAL, ROMANTIC, GOSPEL, TALK (E.G., PODCASTS) | 4 |
| DAY: MONDAY THROUGH FRIDAY | 3 |
| DAY: SATURDAY, SUNDAY | 7 |
| TIME: 8AM TO 8PM | 5 |
| TIME: 8PM TO 2AM | 8 |
| TIME: 2AM – 8AM | 2 |
| LOCATION: MOVING / STATIONARY | 3 / 7 |
| LOCATION: HOME, DORM ROOM, LAUNDROMAT | 5 |
| LOCATION: SPORTING EVENT, PARK, TAVERN, FAMILY COTTAGE | 7 |
| LOCATION: LIBRARY, CHURCH, HOSPITAL | 2 |

Related U.S. Application Data continuation of application No. 15/469,614, filed on Mar. 27, 2017, now Pat. No. 9,948,256.

(51) Int. Cl.
*H03G 3/04* (2006.01)
*H03G 3/30* (2006.01)

(58) Field of Classification Search
USPC .............................. 381/104, 107, 109, 56–57
See application file for complete search history.

(56) References Cited

U.S. PATENT DOCUMENTS

| | | |
|---|---|---|
| 9,431,982 B1 | 8/2016 | Yang et al. |
| 9,548,713 B2 | 1/2017 | Wang et al. |
| 9,824,719 B2 | 11/2017 | Gehring |
| 9,948,256 B1 | 4/2018 | Dow et al. |
| 2005/0089177 A1 | 4/2005 | Hughes et al. |
| 2006/0233381 A1* | 10/2006 | Seo ................. H04S 1/007 381/56 |
| 2008/0153537 A1 | 6/2008 | Khawand et al. |
| 2010/0027812 A1 | 2/2010 | Moon et al. |
| 2011/0095875 A1 | 4/2011 | Thyssen et al. |
| 2014/0173519 A1 | 6/2014 | Sassi |
| 2014/0334644 A1 | 11/2014 | Selig et al. |
| 2018/0278223 A1 | 9/2018 | Dow et al. |

OTHER PUBLICATIONS

Appendix P—List of IBM Patents or Patent Applications Treated as Related, Filed herewith, 2 Pages.

* cited by examiner

| VOLUME ATTRIBUTE 302 | DEFAULT VOLUME PRESET 304 |
|---|---|
| SPEAKER DRIVERS: 1 / 2-3 / >3 | 3 / 5 / 7 |
| AUDIO: LIVE / RECORDED | 6 / 4 |
| GENRE: HEAVY METAL, ROCK, HIP HOP, ELECTRONIC DANCE MUSIC | 8 |
| GENRE: COUNTRY WESTERN, EASY LISTENING, POP, RHYTHM AND BLUES | 6 |
| GENRE: CLASSICAL, JAZZ, INSPIRATIONAL, ROMANTIC, GOSPEL, TALK (E.G., PODCASTS) | 4 |
| DAY: MONDAY THROUGH FRIDAY | 3 |
| DAY: SATURDAY, SUNDAY | 7 |
| TIME: 8AM TO 8PM | 5 |
| TIME: 8PM TO 2AM | 8 |
| TIME: 2AM – 8AM | 2 |
| LOCATION: MOVING / STATIONARY | 3 / 7 |
| LOCATION: HOME, DORM ROOM, LAUNDROMAT | 5 |
| LOCATION: SPORTING EVENT, PARK, TAVERN, FAMILY COTTAGE | 7 |
| LOCATION: LIBRARY, CHURCH, HOSPITAL | 2 |

SPEAKER VOLUME PREFERENCE LEARNING

BACKGROUND

The present invention relates generally to the field of audio playback, and more particularly to presetting the volume for a user during audio playback.

Many forms of audio exist of which people enjoy listening. Some examples of audio include music, podcasts, seminars, and sports. Some forms of audio may be live while other forms of audio may be prerecorded. A user may listen to audio in a "public" manner using speakers that anyone in the area can hear or the user may listen in a "private" manner using speakers (e.g., headphones, earbuds) that only the user is able to hear. Often, a user may listen to a certain type of audio at a specific volume. For example, while listening to rock music, a user may prefer the volume to be loud. In another example, a user may prefer a low volume while listening to music during a romantic dinner.

SUMMARY OF THE INVENTION

Embodiments of the present invention include an approach for presetting the volume for a user during audio playback. In one embodiment, audio information of audio content being listened to by a user is received. An aspect of a listening environment of the user is identified. A volume preset, based on the audio information and the aspect of the listening environment, is determined to be available. A first volume of the audio content being listened to by the user is determined to be different from the volume preset. The first volume of the audio content is adjusted to a second volume.

BRIEF DESCRIPTION OF THE DRAWINGS

FIG. 3 depicts an example table that include volume attributes and corresponding default volume presets, in accordance with an embodiment of the present invention.

DETAILED DESCRIPTION

Embodiments of the present invention provide for presetting the volume for a user during audio playback. A user listening to audio (e.g., a recorded lecture about a favorite hobby) may set a particular volume on an audio device. A day later, the user may turn on the audio device to listen to a broadcast of a football game and may need to adjust the volume to a different level based on any number of factors such as time of day, day of the week, location, etc.

Embodiments of the present invention recognize that there may be an approach for presetting the volume for a user during audio playback. In an embodiment, user preferences may be learned over time such that audio volume may be preset based on the learned user preferences. In an embodiment, preferences associated with preferred volume levels such as music genre, type of speakers, time of the day, day of the week, location, etc., may be learned and used to preset the volume level of particular audio for a given set of conditions.

The present invention will now be described in detail with reference to the Figures.

Figure 1:
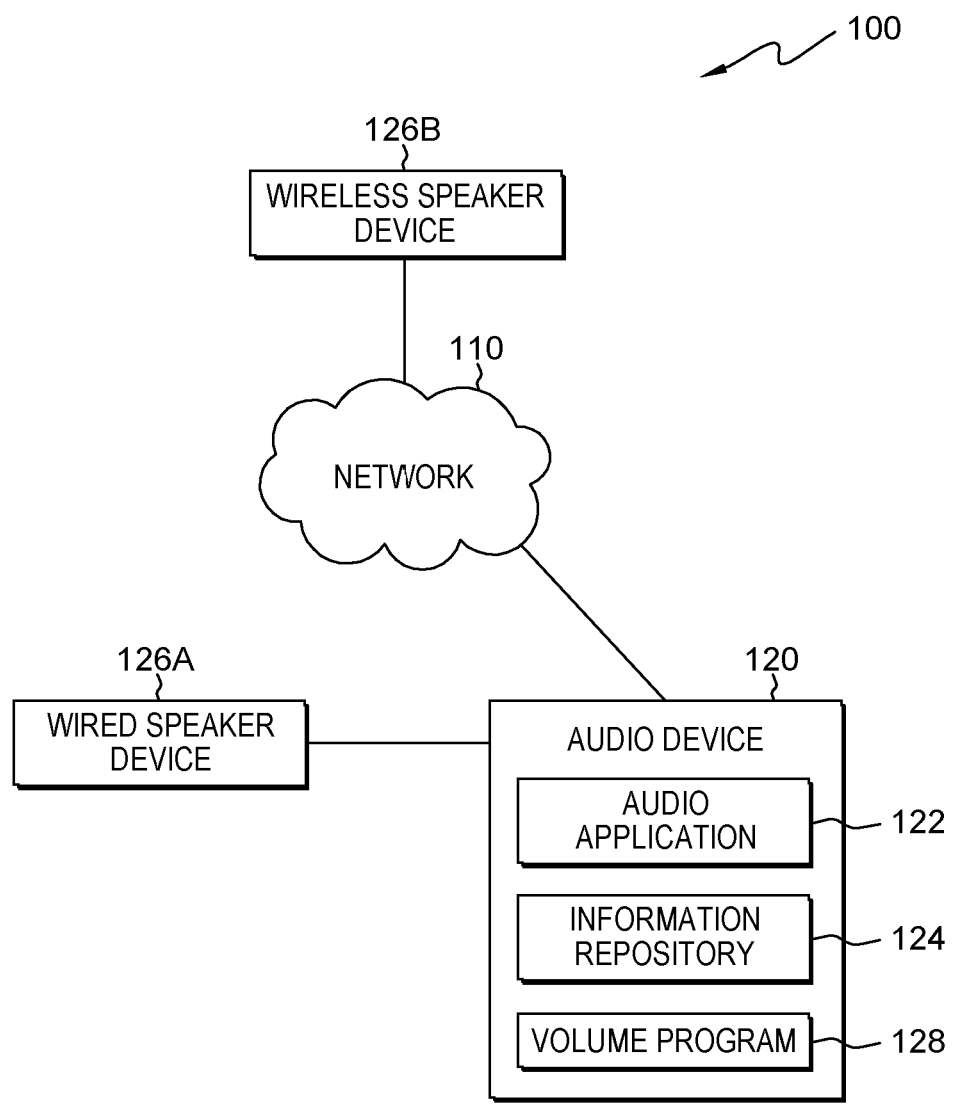
FIG. 1 depicts a functional block diagram of a computing environment, in accordance with an embodiment of the present invention.

FIG. 1 is a functional block diagram illustrating a computing environment, generally designated 100, in accordance with one embodiment of the present invention. FIG. 1 provides only an illustration of one implementation and does not imply any limitations with regard to the systems and environments in which different embodiments may be implemented. Many modifications to the depicted embodiment may be made by those skilled in the art without departing from the scope of the invention as recited by the claims.

In an embodiment, computing environment 100 includes audio device 120 and wireless speaker device 126B connected to network 110. In example embodiments, computing environment 100 may include other computing devices (not shown in FIG. 1) such as smartwatches, cell phones, smartphones, wearable technology, phablets, tablet computers, laptop computers, desktop computers, other computer servers or any other computer system known in the art, interconnected with audio device 120 and wireless speaker device 126B over network 110.

In an embodiment of the present invention, audio device 120 and wireless speaker device 126B connect to network 110, which enables audio device 120 and wireless speaker device 126B to access other computing devices and/or data not directly stored on audio device 120 and wireless speaker device 126B. In another embodiment, audio device 120 and wireless speaker device 126B are connected to one another via a short distance personal area network (PAN). Network 110 may be, for example, a short-range, low power wireless connection, a local area network (LAN), a telecommunications network, a wide area network (WAN) such as the Internet, or any combination of the three, and include wired, wireless, or fiber optic connections. Network 110 may include one or more wired and/or wireless networks that are capable of receiving and transmitting data, voice, and/or video signals, including multimedia signals that include voice, data, and video information. In general, network 110 can be any combination of connections and protocols that will support communications between audio device 120, wireless speaker device 126B, and any other computing devices connected to network 110, in accordance with embodiments of the present invention. In an embodiment, data received by another computing device (not shown in FIG. 1) in computing environment 100 may be communicated to audio device 120 and wireless speaker device 126B via network 110.

In embodiments of the present invention, audio device 120 may be a laptop, tablet, or netbook personal computer (PC), a desktop computer, a personal digital assistant (PDA), a smartphone, a standard cell phone, a smart-watch or any other wearable technology, or any other hand-held, programmable electronic device capable of communicating with any other computing device within computing environment 100. In an embodiment, computing environment 100 includes any number of audio device 120.

In certain embodiments, audio device 120 represents a computer system utilizing clustered computers and components (e.g., database server computers, application server computers, etc.) that act as a single pool of seamless resources when accessed by elements of computing environment 100. In general, audio device 120 is representative of any electronic device or combination of electronic devices capable of executing computer readable program instructions. Audio device 120 may include components as depicted and described in further detail with respect to FIG. 4, in accordance with embodiments of the present invention.

According to an embodiment of the present invention, audio device 120 includes audio application 122, information repository 124, wired speaker device 126A, and volume program 128. In an embodiment, audio application 122 may be an application used for playing audio for a user. Audio may be defined as sound, especially when recorded, transmitted, or reproduced. In an embodiment, audio may be live, recorded, and a combination of live and recorded. Examples of audio application 122 include an application for listening to live audio such as a radio application and an application for listening to recorded audio such as a podcast application or music application.

According to embodiments of the present invention, information repository 124 may be storage that may be written to and/or read by volume program 128. In one embodiment, information repository 124 resides on audio device 120. In other embodiments, information repository 124 may reside on any other device (not shown in FIG. 1) in computing environment 100, in cloud storage or on another computing device accessible to volume program 128 via network 110. In yet another embodiment, information repository 124 may represent multiple storage devices within audio device 120. Examples of data stored to information repository 124 include genres of music listened to by a user, locations where a user listens to audio and the types of audio listened to at those locations, information concerning any wired or wireless speaker devices used by a user, and time of day/day of week information that the user listens to audio and the types of audio listened to at those times of day and on those days of the week.

In an embodiment, information repository 124 may be implemented using any volatile or non-volatile storage media for storing information, as known in the art. For example, information repository 124 may be implemented with a tape library, optical library, one or more independent hard disk drives, multiple hard disk drives in a redundant array of independent disks (RAID), solid-state drives (SSD), or random-access memory (RAM). Similarly, information repository 124 may be implemented with any suitable storage architecture known in the art, such as a relational database, an object-oriented database, or one or more tables. In an embodiment of the present invention, audio application 122, volume program 128, and any other programs and applications (not shown) operating on audio device 120 may store, read, modify, or write data to information repository 124.

In an embodiment, wired speaker device 126A and wireless speaker device 126B are electroacoustic devices that are connected as a component in an audio system that change electrical signals into sounds so that a user may hear the sounds. In an embodiment, wired speaker device 126A is physically connected to audio device 120. In an embodiment, wireless speaker device 126B is wirelessly connected to audio device 120. Wired speaker device 126A and wireless speaker device 126B are substantially similar with the exception of the physical or wireless connection to audio device 120. For ease of reading this document, speaker device 126 will be used to refer to either or both of wired speaker device 126A and wireless speaker device 126B. In an embodiment, the function of speaker device 126 is to make speech or music audible to a user. In an embodiment, speaker device 126 is a passive (i.e., unpowered) device. In another embodiment, speaker device 126 is an active (i.e., powered) device. In an embodiment, speaker device 126 receives audio signals routed through a single channel and produces monophonic sound. In another embodiment, speaker device 126 receives audio signals routed through two or more channels and produces stereophonic sound.

According to embodiments of the present invention, volume program 128 may be a program, a subprogram of a larger program, an application, a plurality of applications, or mobile application software, which functions to preset the volume for a user during audio playback. In an embodiment, audio may be live, such as audio from a sporting event. In another embodiment, audio may be prerecorded, such as audio from recorded music. A program is a sequence of instructions written by a programmer to perform a specific task. Volume program 128 may run by itself but may be dependent on system software (not shown in FIG. 1) to execute. In one embodiment, volume program 128 functions as a stand-alone program residing on audio device 120. In another embodiment, volume program 128 may work in conjunction with other programs, applications, etc., found in computing environment 100. In yet another embodiment, volume program 128 may be found on other computing devices (not shown in FIG. 1) in computing environment 100, which are interconnected to audio device 120 via network 110.

In an embodiment, volume program 128 may determine audio information. In an embodiment, volume program 128 may determine information regarding available speakers. In an embodiment, volume program 128 may determine day of the week and time of the day information. In an embodiment, volume program 128 may determine location information. In an embodiment, volume program 128 may preset a volume for a user during audio playback.

Figure 2:
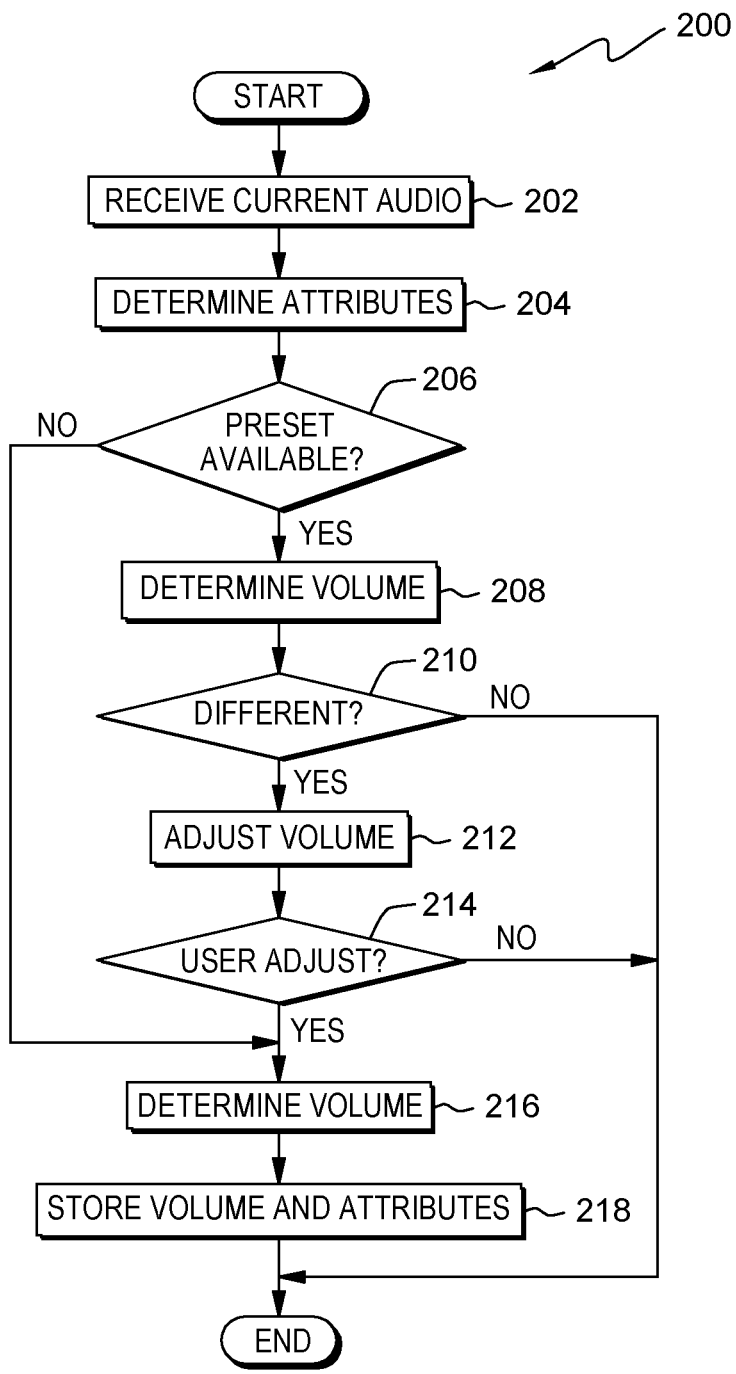
FIG. 2 depicts a flowchart of a program for presetting the volume for a user during audio playback, in accordance with an embodiment of the present invention.

FIG. 2 is a flowchart of workflow 200, depicting a method for presetting the volume for a user during audio playback. In one embodiment, the method of workflow 200 is performed by volume program 128. In an alternative embodiment, the method of workflow 200 may be performed by any other program working with volume program 128. In an embodiment, a user, via a user interface (not shown in FIG. 1), may invoke workflow 200 upon opening an application, such as audio application 122. In an alternative embodiment, a user may invoke workflow 200 upon accessing volume program 128.

In an embodiment, volume program 128 receives current audio (step 202). In other words, volume program 128 determines information regarding the audio listened to by a user. In an embodiment, volume program 128 uses available audio metadata to determine audio information such as type of audio, musical genre, recording levels, etc. In another embodiment, volume program 128 analyzes audio in real-time to determine the audio information. In an embodiment, volume program 128 determines whether the audio is live or recorded. Examples of live audio include live talk shows, seminars, musical concerts, sporting events, and the like. Examples of recorded audio include recorded music, including concerts, podcasts discussing a plurality of topics, replays of any of the plurality of live audio, videos, and the like. In an embodiment, a user may listen to live audio at a louder volume because of background noise compared to how the user listens to recorded audio that may have the volume level of background noise reduced. In an embodiment, volume program 128 determines the genre of music audio. Examples of music genres include rock, heavy metal, country and western, easy listening, pop, classical, blues, jazz, electronic, hip hop, inspirational, electronic dance music, reggae, rhythm and blues, romantic, and the like. In an embodiment, a user may prefer to listen to heavy metal music at a loud volume and easy listening music at a lower relative volume. In an embodiment, the determined audio information may be stored to memory. In an embodiment, volume program 128 determines the type of audio played by audio application 122 on audio device 120 over speaker device 126. In the embodiment, the type of audio being played is stored to information repository 124. In a first example, "Joe" is listening to a live rock concert. In a second example, "Sue" is listening to a recorded fantasy football podcast.

In an embodiment, volume program 128 determines attributes (step 204). In other words, volume program 128 determines (i.e., identifies) the current attributes of the listening environment of the user. According to embodiments of the present invention, the attributes determined by volume program 128 include audio information (previously discussed), speaker information, day of week and time of day information, and location information (discussed below).

In an embodiment, volume program 128 determines speaker information. In other words, volume program 128 determines attribute information related to the speakers being used during audio playback. In an embodiment, the speaker information is determined via an input by a user. In an embodiment, the speakers may be physically connected to the audio device. Examples of physically connected speakers included internal speakers of the audio device, public speakers that are connected to the audio device using wires and/or cables (e.g., loudspeakers), and private speakers that are connected to the audio device using wires (e.g., headphones and earbuds). In another embodiment, the speakers may be wirelessly connected to the audio device. Examples of wirelessly connected speakers include headphones and earbuds connected via a short distance wireless network or near field communication (NFC) and a plurality of individual speakers connected to one another and the audio device via a mesh network. In an embodiment, volume program 128 determines the drivers included in the speakers used during audio playback. Examples of drivers include a mid-range driver, a high-range driver (i.e., a tweeter), a low-range driver (i.e., a woofer), and an external, low-range driver (i.e., a sub-woofer). In an embodiment, volume program 128 determines if the speakers being used during audio playback are monophonic (i.e., single channel) or stereophonic (i.e., two or more channels). In an embodiment, the determined speaker information is stored to a memory. In an embodiment, volume program 128 determines the type of speaker that speaker device 126 is and how speaker device 126 is connected to audio device 120. In the embodiment, the determined speaker type and determined connection to audio device 120 is stored to information repository 124. In the first example, "Joe" is listening to the live rock concert through a plurality of speakers consisting of a tweeter, two mid-range drivers, and a woofer that are hard-wired to a high fidelity (hi-fi) stereo system. In the second example, "Sue" is listening to the recorded fantasy football podcast through inexpensive earbuds that are wirelessly connected to a smartphone.

In an embodiment, volume program 128 determines day/time information. In other words, volume program 128 determines that day of the week that a user is listening to audio and also determines the time of day that the user is listening to the audio. In an embodiment, the day/time information is determined by a calendar and a clock (respectively) in audio device 120. In another embodiment, the day/time information is determined via an input by the user. In an embodiment, the day of the week may be a weekday (e.g., Monday, Tuesday, Wednesday, Thursday, and Friday) or a weekend day (e.g., Saturday and Sunday). In an embodiment, the time of day may be any time in a twenty-four hour period (e.g., 7:00 AM, 5:30 PM, 11:00 PM, etc.) or may be grouped in a user-defined grouping (e.g., early morning, 4:00 AM to 7:00 AM; morning, 7:01 AM to 11:00 AM; mid-day, 11:01 AM to 2:00 PM; afternoon, 2:01 PM to 5:00 PM; evening, 5:01 PM to 9:00 PM; night, 9:01 PM to 12:00 AM; and late-night, 12:01 AM to 4:00 AM). In an embodiment, the determined time of day and day of week information is stored to a memory. In an embodiment, volume program 128 determines the current day of the week and the current time of the day that a user is listening to audio via speaker device 126 connected to audio device 120. In the embodiment, the current day of the week and the current time of the day that a user is listening to the audio is stored to information repository 124. In the first example, "Joe" is listening to the live rock concert at 10:00 PM on Saturday. In the second example, "Sue" is listening to the recorded fantasy football podcast at 11:30 AM on Tuesday.

In an embodiment, volume program 128 determines location information. In other words, volume program 128 determines the location where a user is listening to audio. In an embodiment, volume program 128 determines a specific location based on global positioning system (GPS) data and geographic information system (GIS) data. GPS is a space-based radio navigation system that provides geo-location and time information to a GPS receiver in all weather conditions and the GPS system operates independently of any telephonic or Internet reception. GIS is an information system that integrates, stores, edits, analyzes, shares, and displays geographic information. In another embodiment, location information is determined via a user input. Examples of specific locations include at home, in a dorm room, at a stadium, at a library, at a concert venue, at a park, and the like. In an embodiment, volume program 128 determines whether the user listening to audio is stationary or moving based on GPS data. Examples of stationary locations include any location that the user is not moving. Examples of moving locations include driving a vehicle (e.g., driving a car or other type of vehicle) and riding in a vehicle (e.g., being a passenger in a car, bus, train, taxicab, plane, etc.), jogging, swimming, and the like. In an embodiment, the determined location information is stored to a memory. In an embodiment, volume program 128 determines that a user, listening to audio playback on audio device 120 via speaker device 126, is at a stationary location. In the embodiment, the stationary location is stored to information repository 124. In the first example, "Joe" is listening to the live rock concert at the family cottage. In the second embodiment, "Sue" is listening to the recorded fantasy football podcast while riding in a taxicab.

In an embodiment, volume program 128 determines whether a volume preset is available (decision step 206). In other words, volume program 128 determines whether a volume preset has been stored and is available for the current listening attributes. In an embodiment (decision step 206, NO branch), volume program 128 determines that a volume preset is not available for the current listening attributes; therefore, volume program 128 proceeds to step 216 to determine the volume. In the embodiment (decision step 206, YES branch), volume program 128 determines that a volume preset is available for the current listening attributes; therefore, volume program 128 proceeds to step 208.

In an embodiment, volume program 128 determines volume (step 208). In other words, volume program 128 determines the current volume being used for audio playback by the user. In an embodiment, the current volume is determined by checking the volume setting in the audio application (e.g., audio application 122) being used for the audio playback. In another embodiment, the current volume is determined by sampling the audio playback via a microphone (if available) included in the audio device (e.g., audio device 120). In an embodiment, volume program 128 determines the current volume of audio application 122 in audio device 120. In the first example, "Joe" is listening to the live rock concert at a volume level of "6" on a scale of "0" (mute) to "10" (loudest). In the second example, "Sue" is listening to the recorded fantasy football podcast at a volume of "4" on a scale of "0" (mute) to "10" (loudest).

In an embodiment, volume program 128 determines whether the volumes are different (decision step 210). In other words, volume program 128 determines whether the available preset volume is different from the determined current volume. In an embodiment (decision step 210, NO branch), volume program 128 determines that there is not a difference between the available preset volume and the determined current volume; therefore, volume program 128 ends. In the embodiment (decision step 210, YES branch), volume program 128 determines that there is a difference between the available preset volume and the determined current volume; therefore, volume program 128 proceeds to step 212.

In an embodiment, volume program 128 adjusts volume (step 212). In other words, volume program 128 adjusts the volume of the audio playback to the available preset volume. In an embodiment, the volume may be adjusted to a specific volume based on a scale of "0" (mute) to "10" (loudest). For example, as a rock song ends at a volume of "8" and a pop song starts playing, the volume is changed to "6". In another embodiment, a comparative adjustment is made to the volume. For example, a user is listening to a rock song at a volume level lower than the preset volume (e.g., "6" instead of "8"). In the example, when the rock song ends and the pop song begins, the volume is lowered from "6" to "4", even though "6" is the usual level for the pop song, because the pop song is played at a lower volume level than the rock song. In an embodiment, volume program 128 adjusts the volume of audio application 122, on audio device 120, to the available preset volume. In the first example, the volume is adjusted to "7" from the current volume of "6". In the second example, no adjustment is made to the volume as the current volume is the same volume as the preset volume.

In an embodiment, volume program 128 determines whether the user adjusts the volume (decision step 214). In other words, volume program 128 determines whether the user adjusts the current volume (i.e., a change from the preset volume). In an embodiment (decision step 214, NO branch), the user does not adjust the current volume; therefore, volume program 128 ends. In the embodiment (decision step 214, YES branch), the user does adjust the current volume; therefore, volume program 128 proceeds to step 216.

In an embodiment, volume program 128 determines volume (step 216). In other words, volume program 128, determines the volume based on the adjustment to the volume by the user. In an embodiment, the volume is determined by checking the volume setting in the audio application (e.g., audio application 122) being used for the audio playback. In another embodiment, the volume is determined by sampling the audio playback via a microphone (if available) included in the audio device (e.g., audio device 120). In an embodiment, volume program 128 determines the current volume of audio application 122 in audio device 120. In the first example, "Joe" has adjusted the volume from "7" to "9" so the volume of "9" is determined. In the second example, "Sue" has not adjusted the volume so the volume is not determined.

In an embodiment, volume program 128 stores the volume and attributes (step 218). In other words, volume program 128 stores the adjusted volume and the associated volume attributes related to the current audio playback. In an embodiment, the adjusted volume and associated volume attributes are stored by volume program 128 to information repository 124 on audio device 120. In the first example, the determined volume of "9" is stored along with the associated volume attributes (i.e., "Joe" is listening to a live rock concert through loudspeakers with four drivers wired to a hi-fi system at 10:00 PM on a Saturday night while stationary at the family cottage). In the second example, no additional information is stored as "Sue" has not adjusted the volume level from the preset level determined previously.

In an embodiment, volume program 128 includes a learning feature so that changing habits of a user are taken into consideration by volume program 128 when presetting a volume for the user. In an embodiment, only the most recent information stored to memory is used by volume program 128 to preset the volume. In another embodiment, an average volume over a pre-defined period of time (e.g., one day, one week, one month, etc.) is used by volume program 128 to preset the volume. In an embodiment, volume program 128 monitors the "success" rate of the present volume (i.e., does the user change the preset volume) and uses the "success" rate to preset the volume for the user.

FIG. 3 depicts table 300, an example table that includes volume attributes 302 (i.e., various factors that may affect how a user selects a certain volume) and a corresponding default volume preset 304. In an embodiment, volume program 128 includes a default version of table 300. In another embodiment, a user may change the default volume preset 304 for a corresponding volume attribute 302 within table 300. In yet another embodiment, a user may add one or more volume attributes 302 and corresponding default volume presets 304 to table 300. In yet another embodiment, a user may remove one or more volume attributes 302 and corresponding default volume presets 304 in table 300.

In an embodiment, the default volume preset 304 in table 300 may be a number from zero to ten, inclusive, with zero representing mute, one representing the lowest possible volume, and ten representing the highest possible volume. In another embodiment, the default volume preset 304 in table 300 may be a low, low-medium, medium, medium-high or high level volume setting. In yet another embodiment, the default volume preset 304 in table 300 may be a soft, normal, or loud volume setting.

In an embodiment, the final volume preset is a calculation of the simple average of applicable default volume presets 304 from table 300. In the first example, "Joe" is listening to a live (default volume preset 304 of "6") rock ("8") concert through loudspeakers with four drivers ("7") at 10:00 PM ("8") on a Saturday ("7") while stationary ("7") at the family cottage ("7"). Therefore, the determined (i.e., final) volume preset is "7", which is the simple average of the seven individual default volume preset 304 values. Now, in the first example, assume "Joe" makes the following changes: "Joe" starts using inexpensive earbuds ("3" instead of "7"), listens to a jazz ("4" instead of "8") recording ("4" instead of "6"), and stays up until 3:00 AM ("2" instead of "8"), the determined final volume preset would be "5", which is the simple average of the seven individual default volume preset 304 values.

In an embodiment, the final volume preset is a calculation of the weighted average of applicable default volume presets 304 from table 300. In an embodiment, weighting of the default volume presets 304 may be predefined in table 300. For example, the time of day default volume preset 304 may be weighted by a factor of one hundred twenty percent if the time of day volume attribute 302 is deemed more important that other volume attributes 302. In another example, a user may determine the weighting, if any, of the default volume presets 304. In the second example, "Sue" determines that the time of day volume attribute 302 is somewhat more important than other volume attributes 302 so "Sue" assigns a weight of one hundred twenty percent to the time of day default volume preset 304. "Sue" also determines that genre volume attribute 302 is far more important than other volume attributes 302 so "Sue" assigns a weight of two hundred percent to the genre default volume preset 304. Therefore, in the second example, "Sue" is listening to the recorded ("4") fantasy football podcast (2×"4") through inexpensive earbuds ("3") wirelessly connected to a smartphone at 11:30 AM (1.2×"5") on Tuesday ("3") while riding in a taxicab ("3") so the volume for the audio is preset to "5". Without the weighting of the time of day and genre volume attributes 302, the volume for the audio would have been preset to "4".

Figure 4:
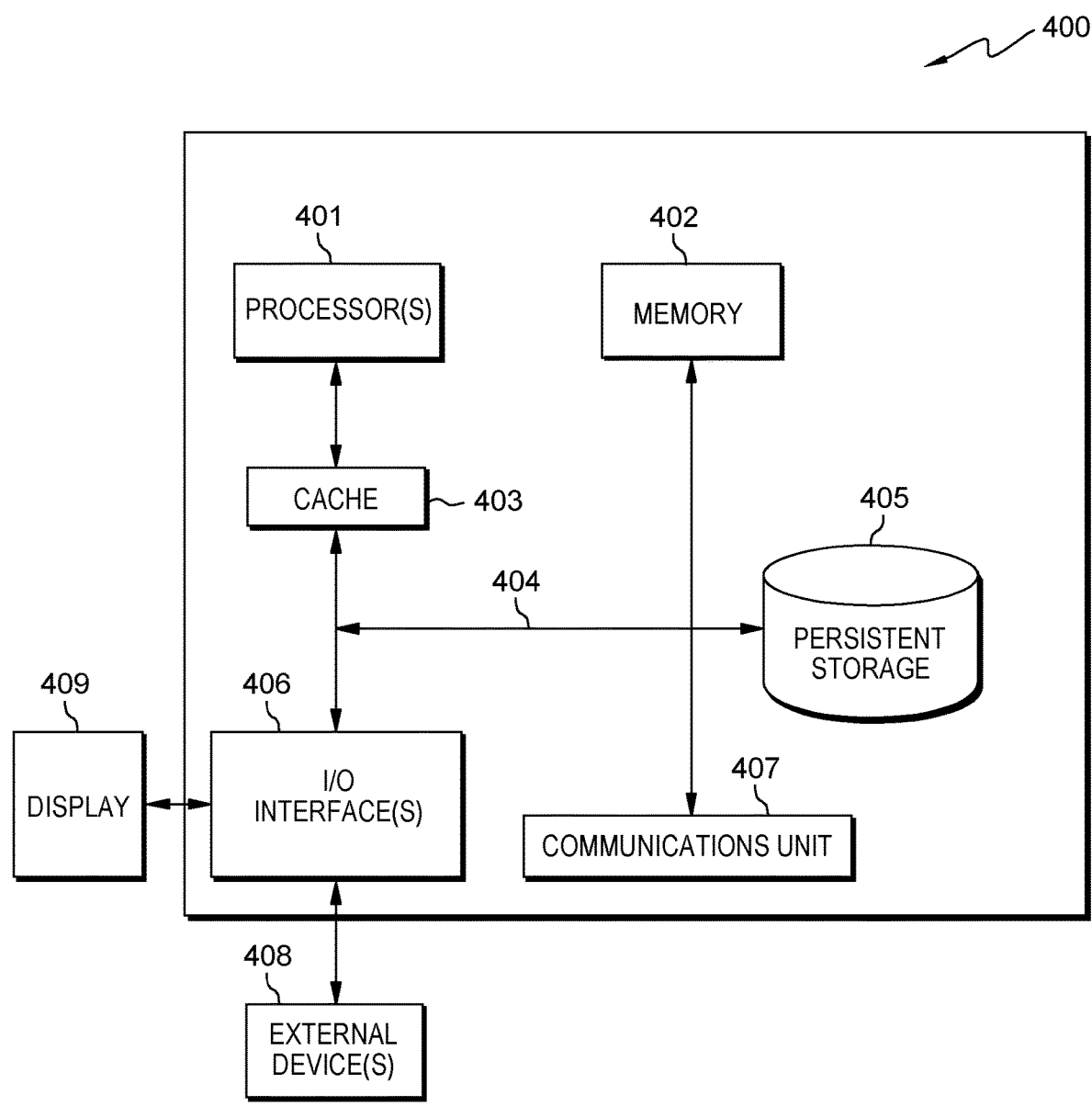
FIG. 4 depicts a block diagram of components of the computing environment of FIG. 1, in accordance with an embodiment of the present invention.

FIG. 4 depicts computer system 400, which is an example of a system that includes volume program 128. Computer system 400 includes processors 401, cache 403, memory 402, persistent storage 405, communications unit 407, input/output (I/O) interface(s) 406 and communications fabric 404. Communications fabric 404 provides communications between cache 403, memory 402, persistent storage 405, communications unit 407, and input/output (I/O) interface(s) 406. Communications fabric 404 can be implemented with any architecture designed for passing data and/or control information between processors (such as microprocessors, communications and network processors, etc.), system memory, peripheral devices, and any other hardware components within a system. For example, communications fabric 404 can be implemented with one or more buses or a crossbar switch.

Memory 402 and persistent storage 405 are computer readable storage media. In this embodiment, memory 402 includes random access memory (RAM). In general, memory 402 can include any suitable volatile or non-volatile computer readable storage media. Cache 403 is a fast memory that enhances the performance of processors 401 by holding recently accessed data, and data near recently accessed data, from memory 402.

Program instructions and data used to practice embodiments of the present invention may be stored in persistent storage 405 and in memory 402 for execution by one or more of the respective processors 401 via cache 403. In an embodiment, persistent storage 405 includes a magnetic hard disk drive. Alternatively, or in addition to a magnetic hard disk drive, persistent storage 405 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 405 may also be removable. For example, a removable hard drive may be used for persistent storage 405. Other examples include optical and magnetic disks, thumb drives, and smart cards that are inserted into a drive for transfer onto another computer readable storage medium that is also part of persistent storage 405.

Communications unit 407, in these examples, provides for communications with other data processing systems or devices. In these examples, communications unit 407 includes one or more network interface cards. Communications unit 407 may provide communications through the use of either or both physical and wireless communications links. Program instructions and data used to practice embodiments of the present invention may be downloaded to persistent storage 405 through communications unit 407.

I/O interface(s) 406 allows for input and output of data with other devices that may be connected to each computer system. For example, I/O interface 406 may provide a connection to external devices 408 such as a keyboard, keypad, a touch screen, and/or some other suitable input device. External devices 408 can also include portable computer readable storage media such as, for example, thumb drives, portable optical or magnetic disks, and memory cards. Software and data used to practice embodiments of the present invention can be stored on such portable computer readable storage media and can be loaded onto persistent storage 405 via I/O interface(s) 406. I/O interface(s) 406 also connect to display 409.

Display 409 provides a mechanism to display data to a user and may be, for example, a computer monitor.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

What is claimed is:

1. A method for presetting volume for a user during audio playback, the method comprising:
    identifying, by one or more computer processors, an aspect of a listening environment of audio content being listened to by a user, wherein the audio content includes audio information;
    determining, by one or more computer processors, that a first volume of the audio content being listened to by the user is different than a first volume preset due to a change of the first volume by the user;
    receiving, by one or more computer processors, new audio information of audio content being listened to by the user;
    determining, by one or more computer processors, that a second volume preset is available based on the new audio information and the aspect of the listening environment; and
    adjusting, by one or more computer processors, to a second volume based on the new audio information, the aspect of the listening environment, a volume delta between the first volume preset and the first volume, and the second volume preset.

2. The method of claim 1, wherein the audio information of the audio content is received from metadata of the audio content.

3. The method of claim 1, wherein the aspect of the listening environment is selected from the group consisting of: speaker information, day of week, time of day, and location information.

4. The method of claim 1, further comprising:
    receiving, by one or more computer processors, an adjustment of the second volume by the user to a third volume;
    associating, by one or more computer processors, the third volume with the audio information of the audio content and the aspect of the listening environment; and storing, by one or more computer processors, the third volume, the audio information of the audio content, and the aspect of the listening environment.

5. The method of claim 1, further comprising:
identifying a third volume preset associated with the audio information;
identifying a fourth volume preset associated with the aspect of the listening environment; and
calculating the first volume preset by a simple average of the third volume preset and the fourth volume preset.

6. The method of claim 1, further comprising:
identifying a third volume preset and a first weight associated with the audio information;
identifying a fourth volume preset and a second weight associated with the aspect of the listening environment; and
calculating the first volume preset by a weighted average of the third volume preset and the fourth volume preset.

7. The method of claim 3, wherein the aspect of the listening environment is determined by global positioning system data and geographic information system data.

8. A computer program product for presetting the volume for a user during audio playback, the computer program product comprising:
one or more computer readable storage media; and
program instructions stored on the one or more computer readable storage media, the program instructions comprising:
program instructions to identify an aspect of a listening environment of audio content being listened to by a user, wherein the audio content includes audio information;
program instructions to determine that a first volume of the audio content being listened to by the user is different than a first volume preset due to a change of the first volume by the user;
program instructions to receive new audio information of audio content being listened to by the user;
program instructions to determine that a second volume preset is available based on the new audio information and the aspect of the listening environment; and
program instructions to adjust to a second volume based on the new audio information, the aspect of the listening environment, a volume delta between the first volume preset and the first volume, and the second volume preset.

9. The computer program product of claim 8, wherein the audio information of the audio content is received from metadata of the audio content.

10. The computer program product of claim 8, wherein the aspect of the listening environment is selected from the group consisting of: speaker information, day of week, time of day, and location information.

11. The computer program product of claim 8, further comprising program instructions stored on the one or more computer readable storage media, to:
receive an adjustment of the second volume by the user to a third volume;
associate the third volume with the audio information of the audio content and the aspect of the listening environment; and
store the third volume, the audio information of the audio content, and the aspect of the listening environment.

12. The computer program product of claim 8, further comprising program instructions stored on the one or more computer readable storage media, to:
identify third volume preset associated with the audio information;
identify a fourth volume preset associated with the aspect of the listening environment; and
calculate the first volume preset by a simple average of the third volume preset and the fourth volume preset.

13. The computer program product of claim 8, further comprising program instructions stored on the one or more computer readable storage media, to:
identify a third volume preset and a first weight associated with the audio information;
identify a fourth volume preset and a second weight associated with the aspect of the listening environment; and
calculate the first volume preset by a weighted average of the third volume preset and the fourth volume preset.

14. The computer program product of claim 10, wherein the aspect of the listening environment is determined by global positioning system data and geographic information system data.

15. A computer system for presetting the volume for a user during audio playback, the computer system comprising:
one or more computer processors;
one or more computer readable storage media; and
program instructions stored on the one or more computer readable storage media for execution by at least one of the one or more computer processors, the program instructions comprising:
program instructions to identify an aspect of a listening environment of audio content being listened to by a user;
program instructions to identify an aspect of a listening environment of audio content being listened to by a user, wherein the audio content includes audio information;
program instructions to determine that a first volume of the audio content being listened to by the user is different than a first volume preset due to a change of the first volume by the user;
program instructions to receive new audio information of audio content being listened to by the user;
program instructions to determine that a second volume preset is available based on the new audio information and the aspect of the listening environment; and
program instructions to adjust to a second volume based on the new audio information, the aspect of the listening environment, a volume delta between the first volume preset and the first volume, and the second volume preset.

16. The computer system of claim 15, wherein the audio information of the audio content is received from metadata of the audio content.

17. The computer system of claim 15, wherein the aspect of the listening environment is selected from the group consisting of: speaker information, day of week, time of day, and location information.

18. The computer system of claim 15, further comprising program instructions stored on the one or more computer readable storage media for execution by at least one of the one or more computer processors, to:
receive an adjustment of the second volume by the user to a third volume;
associate the third volume with the audio information of the audio content and the aspect of the listening environment; and store the third volume, the audio information of the audio content, and the aspect of the listening environment.

19. The computer system of claim 15, further comprising program instructions stored on the one or more computer readable storage media for execution by at least one of the one or more computer processors, to:
   identify third volume preset associated with the audio information;
   identify a fourth volume preset associated with the aspect of the listening environment; and
   calculate the first volume preset by a simple average of the third volume preset and the fourth volume preset.

20. The computer system of claim 15, further comprising program instructions stored on the one or more computer readable storage media for execution by at least one of the one or more computer processors, to:
   identify a third volume preset and a first weight associated with the audio information;
   identify a fourth volume preset and a second weight associated with the aspect of the listening environment; and
   calculate the first volume preset by a weighted average of the third volume preset and the fourth volume preset.

* * * * *